United States Patent [19]
Kim et al.

[11] Patent Number: 6,090,220
[45] Date of Patent: Jul. 18, 2000

[54] METHOD FOR TRANSFERRING A WAFER AFTER REMOVING A WASHING SOLUTION

[75] Inventors: Dea Won Kim, Asan; Sam Bok Jang; Kouk Jin Oh, both of Cheonan; Bum Woo Lee, Asan, all of Rep. of Korea

[73] Assignee: Samsung Electronics Co., Ltd., Suwon, Rep. of Korea

[21] Appl. No.: 09/019,157

[22] Filed: Feb. 5, 1998

[30] Foreign Application Priority Data

Mar. 14, 1997 [KR] Rep. of Korea ..................... 97-008644

[51] Int. Cl.$^7$ ................................. B08B 1/02; B08B 5/04
[52] U.S. Cl. ........................... 134/21; 134/25.4; 134/902; 134/37; 134/32
[58] Field of Search ............................. 134/21, 902, 32, 134/37, 25.4, 25.5; 15/309.2

[56] References Cited

U.S. PATENT DOCUMENTS 5,330,577   7/1994   Maeda et al. ............................ 118/722
5,547,515   8/1996   Kudo et al. ............................... 134/21
5,806,138   9/1998   Kawasaki ................................... 15/303

*Primary Examiner*—Zeinab El-Arini
*Attorney, Agent, or Firm*—Jones Volentine, LLP

[57] ABSTRACT

A method for transferring a wafer alternately uses a gas providing device and a vacuum generating device. The method includes decontaminating a wafer by contacting a wafer supporter having a wafer provided thereon with a positive pressure mediated stream of gas provided from suction cups of a transferring assembly, where the suction cups are connected to the gas providing device through a gas transmitting tube. After decontamination, the wafer supporter is vacuum adhered to the transferring assembly by contacting the wafer supporter with the suction cups, where the suction cups are connected to the vacuum generating device through the gas transmitting tube. Because the wafer is transferred by picking up the wafer supporter after removing waste washing solution from the wafer and wafer supporter, breakdown and performance deterioration of the transferring assembly is prevented.

11 Claims, 4 Drawing Sheets

METHOD FOR TRANSFERRING A WAFER AFTER REMOVING A WASHING SOLUTION

BACKGROUND OF THE INVENTION

1. Field of the Invention

The present invention generally relates to a method and apparatus for transferring a wafer, and more particularly to a method and apparatus for transferring a wafer after removing waste washing solution from the wafer. Removal of washing solution from the wafer after the washing step prevents damage to the transferring device.

2. Description of the Related Art

During manufacture of a semiconductor device, a wafer on which integrated circuits (ICs) have been formed is subjected to a sawing step using a diamond-pointed scribing blade to divide the wafer into individual, separate, semiconductor chips. As the scribing blade rotates against the wafer, it abrades the silicon creating small silicon particles. During or after sawing, a washing solution is used to flush away the silicon particles from the wafer. In general, DI water (deionized water) is used as the washing solution.

In the manufacturing process, adhesive tape is attached to the inactive back surface of the wafer to enable manipulation of the wafer. After the wafer sawing step, the individual semiconductor chips remain adhered to the adhesive tape. During processing, a wafer supporting means, i.e., a wafer ring, is used for holding and transferring the wafer. The adhesive tape is attached to a bottom surface of the wafer supporting means which has an opening at its the center to expose the wafer and the wafer is attached to an upper surface of the adhesive tape through the opening. When the wafer is transferred, a transferring device mechanically picks up the wafer supporting means which holds and supports the wafer. The wafer is thereby protected from any damage resulting from mechanical contact between the wafer and the transferring device.

FIG. 1 is a schematic view of a conventional device for transferring a wafer and FIG. 2 is schematic view of an interior portion of the transferring device of FIG. 1. Referring to FIG. 1 and FIG. 2, adhesive tape 22 is attached to a bottom surface of a wafer supporting means 21, i.e., a wafer ring, which has an opening 24 at its center to expose a wafer 20. The wafer 20 is attached to an upper surface of the adhesive tape 22 through opening 24. Using vacuum pressure, transferring means 60 transfers wafer supporting means 21 including wafer 20, to the scribing device. The wafer 20 is subjected to a sawing step using a diamond-pointed scribing blade to divide the wafer into individual, separate, semiconductor chips 23. Silicon particles produced during the wafer sawing step are removed by spraying a washing solution such as DI water on the upper surface of the wafer 20, during or after the wafer sawing step.

After the wafer sawing and washing step, the wafer 20 is unloaded from the scribing device. The wafer supporting means 21 is then picked up using transferring means 60 by contacting the upper surface of the wafer supporting means 21 with suction cups 63 of loading arms 62 of the transferring means 60. More specifically, the transferring means 60 is composed of a loading arm body 61 and four loading arms 62, which extend from the loading arm body 61, and a gas transmitting tube 64 located within the loading arm body 61 and the loading arms 62. The four terminal ends of the gas transmitting tube 64 within the loading arms 62 are each connected to an individual suction cup 63. The terminal end of the gas transmitting tube 64 located within the loading arm body 61 is connected to vacuum generating means 67.

The vacuum pressure is exerted on the suction cups 63 using the vacuum generating means 67 which is connected to the gas transmitting tube 64, whereby wafer 20 is transferred to a designated position by moving transferring means 60.

After the wafer sawing step, however, the wafer ring retains about 40–60% of the washing solution used in the wafer washing step. This remaining washing solution is suctioned into gas transmitting tube 64 via the suction cups 63. The suctioned waste washing solution contaminates the gas transmitting tube 64 and causes failure of the solenoid which generates the vacuum, thus resulting in failure and sudden stoppage of the transferring means 60.

SUMMARY OF THE INVENTION

An object of the present invention is to provide a method and apparatus for transferring a wafer after removing remaining waste washing solution from the wafer supporting means, so that the washing solution is not introduced into the gas transmitting tube when the wafer supporting means is picked up by vacuum pressure generated through the gas transmitting tube.

This and other objects are achieved by the present invention, which provides a method for transferring a wafer comprising the steps of decontaminating a wafer supporting means and a wafer by flow contacting the wafer supporting means and wafer with a positive pressure mediated stream of gas. Then, the wafer supporting means is removably adhered to a transferring means using vacuum pressure for transport. The transferring means includes a gas providing means and a vacuum generating means. The positive pressure mediated stream of gas and the vacuum are alternately provided through one or more suction cups provided on the transferring means.

The method further includes a step of lowering the transferring means toward the wafer supporting means, prior to the step of removably adhering. The step of decontaminating ceases prior to the step of removably adhering and prior to the transferring means physically contacting the wafer supporting means. The step of lowering and the step of decontaminating may be performed simultaneously, or the step of lowering may be performed prior to the step of decontaminating.

The method may also comprise a step of sensing a distance between the transferring means and the wafer supporting means using a sensing means, wherein the step of decontamination ceases when a designated distance between the transferring means and the wafer supporting means has been reached as determined by the sensing means.

In another aspect, the present invention provides an apparatus for transferring a wafer supporter having a wafer provided thereon, comprising a transferring assembly having a plurality of suction cups provided on a lower surface. A gas transmitting assembly is housed within the transferring assembly and is in flow communication with the suction cups. A gas providing means and a vacuum generating means are connected to an input section of the gas transmitting assembly. A controller selectively operates either the gas providing means or the vacuum generating means, to alternately, remove contaminating particles on the wafer supporter and the wafer by flow contacting them with a positive pressure mediated stream of gas provided through the suction cups, and vacuum adhering the wafer supporter and the wafer by applying a vacuum through the suction cups in physical contact with the wafer supporter.

The gas transmitting assembly may include one or more gas transmitting tubes communicating with the gas providing means and the vacuum generating means. A vertical descent cylinder is connected to the transferring assembly for raising and lowering the transferring assembly. A sensing device is disposed on a lower surface of the transferring assembly, for sensing a distance between the transferring assembly and the wafer supporter.

The controller comprises a first switching means connected to the gas providing means for selectively providing the gas to the vertical descent cylinder for raising and lower the vertical descent cylinder; a second switching means connected to the gas providing means for selectively providing the gas to the suction cups to remove the contaminating particles on the wafer supporter and the wafer; and a third switching means connected to the vacuum generating means for selectively providing vacuum pressure to the suction cups in contact with the wafer supporter to vacuum adhere the wafer supporter for transport. The sensing means is also connected to the first switching means for controlling the raising and lowering of the vertical descent cylinder.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE PREFERRED EMBODIMENTS

A preferred embodiment of the present invention is described below with reference to the accompanying drawings.

Figure 1:
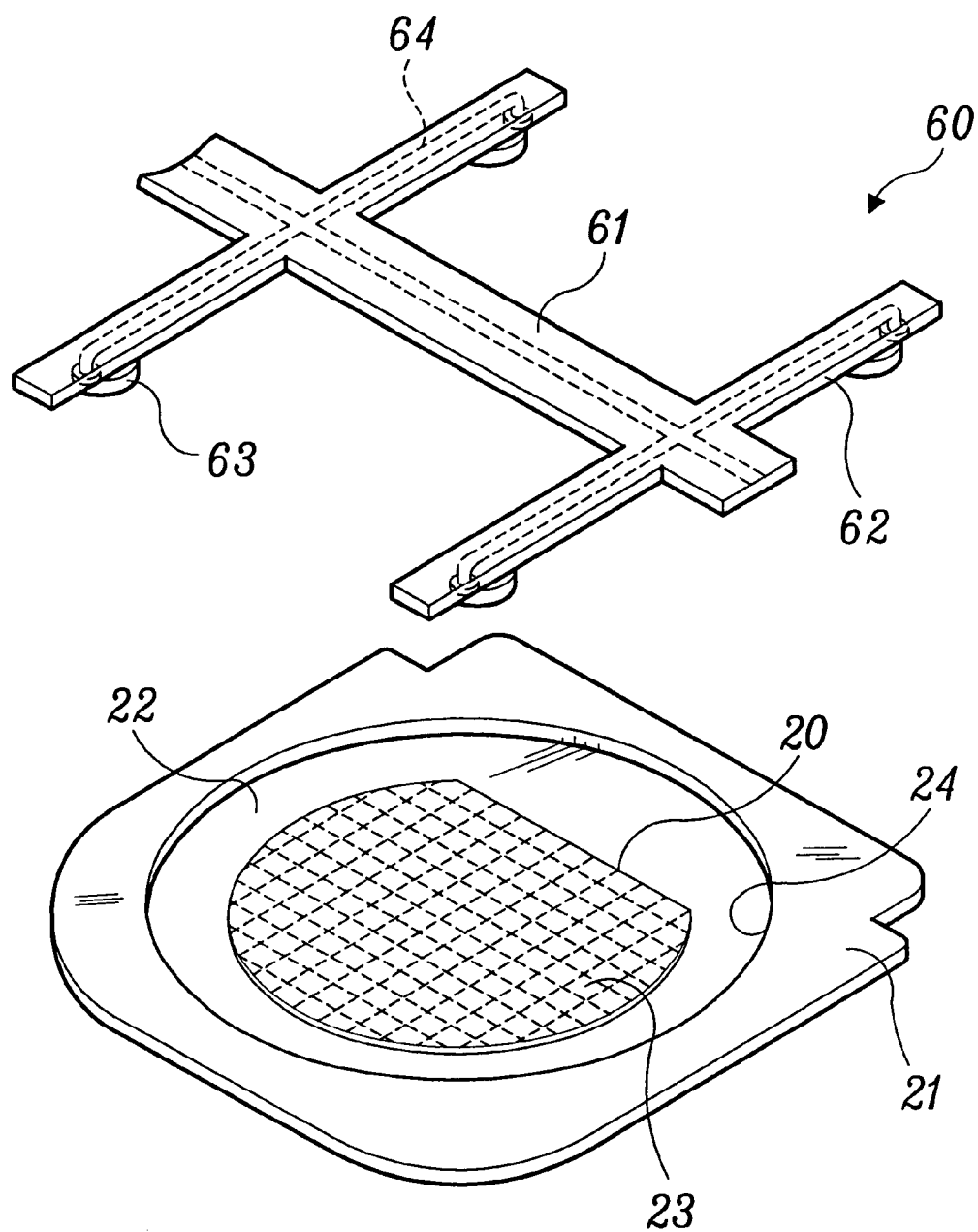
FIG. 1 is a schematic view depicting a conventional device for transferring a wafer.
Figure 2:
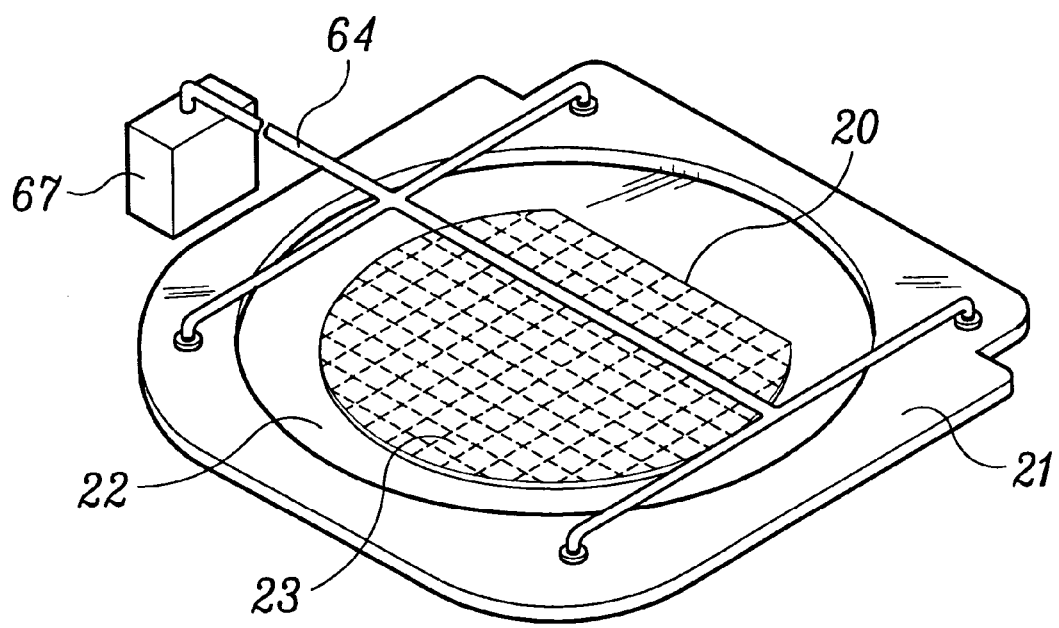
FIG. 2 is a schematic view of the interior section of the transferring device of FIG. 1.
Figure 3:
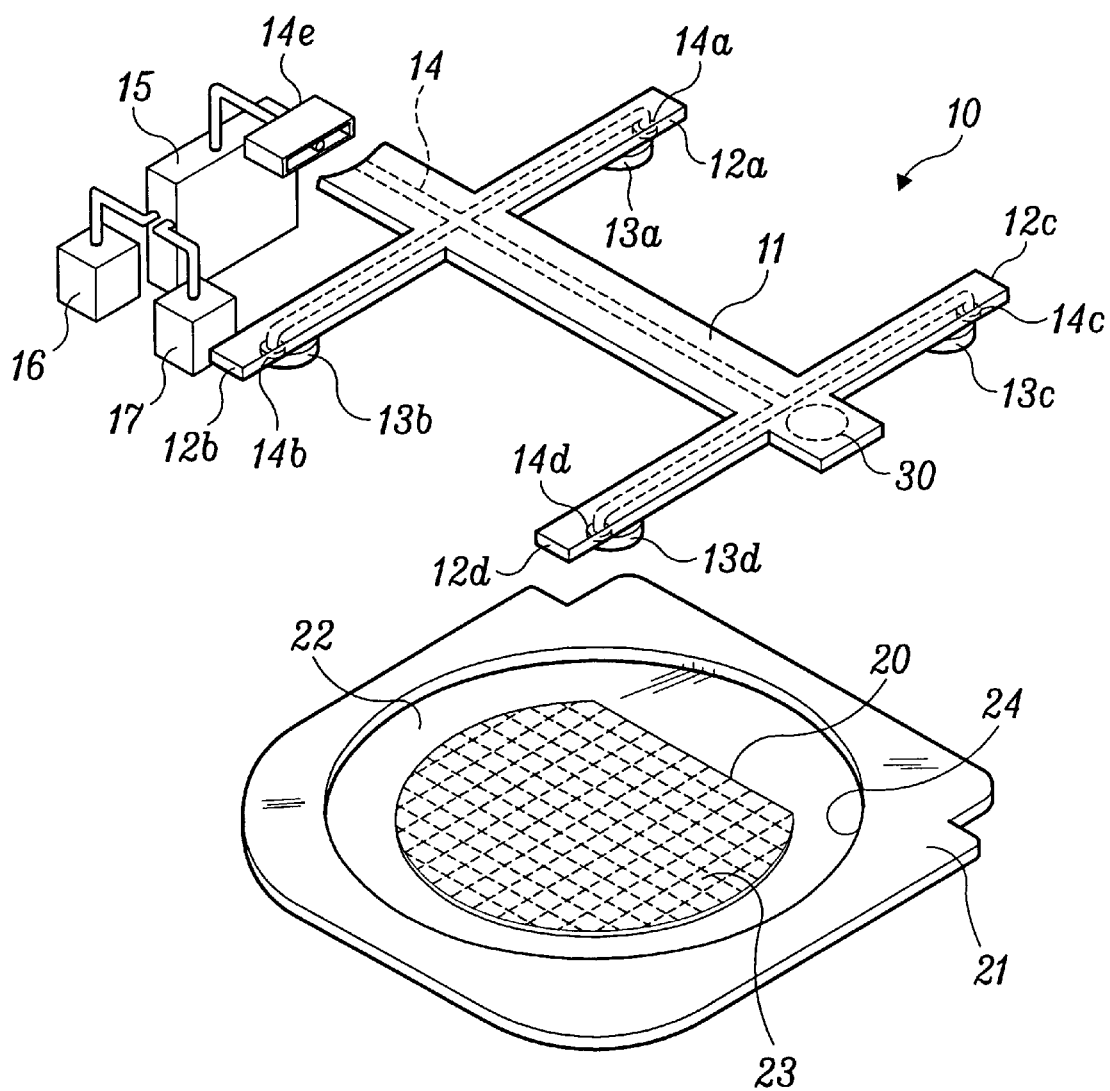
FIG. 3 is a schematic view depicting an apparatus for transferring a wafer according to the present invention.

In FIG. 3, a wafer 20 has been subjected to a sawing step using a diamond-pointed scribing blade to divide the wafer 20 into individual, separate, semiconductor chips 23. Silicon particles produced during the wafer sawing step are removed by spraying a washing solution such as DI water on the upper surface of the wafer 20, during or after the wafer sawing step.

FIG. 3 further depicts a wafer transferring means 10 composed of a gas providing means 16 that provides a positive pressure mediated stream of gas for removing the washing solution from the wafer 20 and wafer supporting means 21, which remains after the wafer washing step. A vacuum generating means 17 generates a vacuum for picking up the wafer supporting means 21 by removably adhering the wafer supporting means 21, having wafer 20 provided thereon, to the transferring means 10 via vacuum pressure. Adhesive tape 22 is attached to a bottom surface of wafer supporting means 21, which has an opening 24 at its center to expose the wafer 20. Wafer 20 is attached to an upper surface of the adhesive tape 22 through the opening 24.

The transferring means 10 has a loading arm body 11 and four loading arms 12a, 12b, 12c, and 12d, which extend from the loading arm body 11, and a gas transmitting tube 14 which is located within the loading arm body 11 and the loading arms 12a–d. Four terminals 14a, 14b, 14c, and 14d, of the gas transmitting tube 14 within the loading arms 12 are each connected to a respective suction cup 13a, 13b, 13c, and 13d, which are formed on a bottom surface of ends of the loading arms 12a–d, and the remaining terminal 14e of the gas transmitting tube 14 within the loading arm body 11 is connected to a controlling means 15. The controlling means 15 is connected to the vacuum generating means 17 as well as to the gas providing means 16.

The wafer 20 is decontaminated by providing a positive pressure stream of a gas to the wafer 20 adhered to the wafer supporting means 21 from suction cups 13 connected to transferring means 10 through the gas transmitting tube 14. During lowering of the transferring means 10 toward the wafer 20, the provision of the positive pressure mediated stream of gas is controlled by controlling means 15. Any remaining contaminants such as moisture, dust, and silicon particles are thereby removed from the wafer 20 by this blowing force.

Gases suitable for use in the present invention include compressed air or nitrogen. The gas is preferably provided as a positive pressure mediated stream at a pressure sufficient to remove the contaminants remaining on the upper surface of the wafer supporting means 21, and more preferably the positive pressure mediated gas stream is provided at a pressure of about 3 bar or more.

During the present process, it is preferable that the positive pressure mediated stream of gas ceases prior to physical contact between the transferring means 10 and the wafer supporting means 21, in order to prevent shaking the wafer supporting means 21. More preferably, transferring means 10 is provided with sensing means 30, located for example, on the lower surface of the loading arm body 11 between the loading arms 12a, 12b or 12c, 12d. One of ordinary skill in the art would recognize that the sensor 30 may be placed anywhere on the transferring means 10 or the wafer supporting means 21. Any conventional distance sensing device may be used, for example, an optical sensor which can successively determine a distance between two objects. Sensing means 30 senses when transferring means 10, during lowering, reaches a designated distance from the upper surface of the wafer supporting means 21. When the designated distance has been reached as determined by sensor 30, the positive pressure mediated stream of gas stops by shutting off the gas providing means 16.

After the positive pressure mediated stream of gas ceases, the wafer supporting means 21 is picked up, via vacuum pressure through the gas transmitting tube 14. Before the transferring means 10 further lowers, and the suction cups 13 of the loading arms 12 physically contact the upper surface of the wafer supporting means 21, the gas providing means 16 shuts down by action of the controlling means 15 and the air inside the gas transmitting tube 14 is evacuated by the operation of the vacuum generating means 17. The suction cups 13 connected to the gas transmitting tube 14 then pick up the wafer supporting means 21. At this time, the transferring means 10 rises along with wafer 20 and wafer supporting means 21. As a result, the wafer 20 is transferred to a designated position by the transferring means 10.

Suitable vacuum pressures includes pressures below 1.0 atm sufficient to removably adhere the wafer supporting means 21 having a wafer 20 provided thereon, to the transferring means 10, without causing damage to the wafer. Suitable pressures can be readily determined and employed by one of ordinary skill in the art without undue experimentation.

The present method for transferring a wafer prevents damage to the gas transmitting tube and to the vacuum generating means connected to the gas transmitting tube, because the transferring means picks up the wafer supporting means after the washing solution remaining on the upper surface of the wafer has been removed by the positive pressure stream of gas.

The present invention contemplates providing the positive pressure mediated stream of gas simultaneously with the lowering of the transferring means 10, or providing the stream of gas after the transferring means 10 is lowered and maintained at a designated distance from the upper surface of the wafer supporting means 21.

The present invention further contemplates providing a single gas transmitting tube 14 connected to both the gas providing means 16 and the vacuum generating means 17, providing two separate gas transmitting tubes 14 which are respectively connected to the gas providing means 16 and the vacuum generating means 17, or providing a plurality of the gas transmitting tubes 14. Use of a plurality of gas transmitting tubes allows the controlling means 15 to be more simply structured. The decontamination step can be performed selectively on a part of the wafer supporting means 21 or on the whole wafer supporting means 21, by changing the number of the suction cups 13, i.e., by increasing the number of suction cups 13 on the transferring means 10.

In an above-described embodiment, one gas transmitting tube 14 is connected to either the gas providing means 16 or the vacuum generating means 17, as controlled by the controlling means 15. The controlling means 15 can be structured in a variety of ways, including the one described below.

Figure 4:
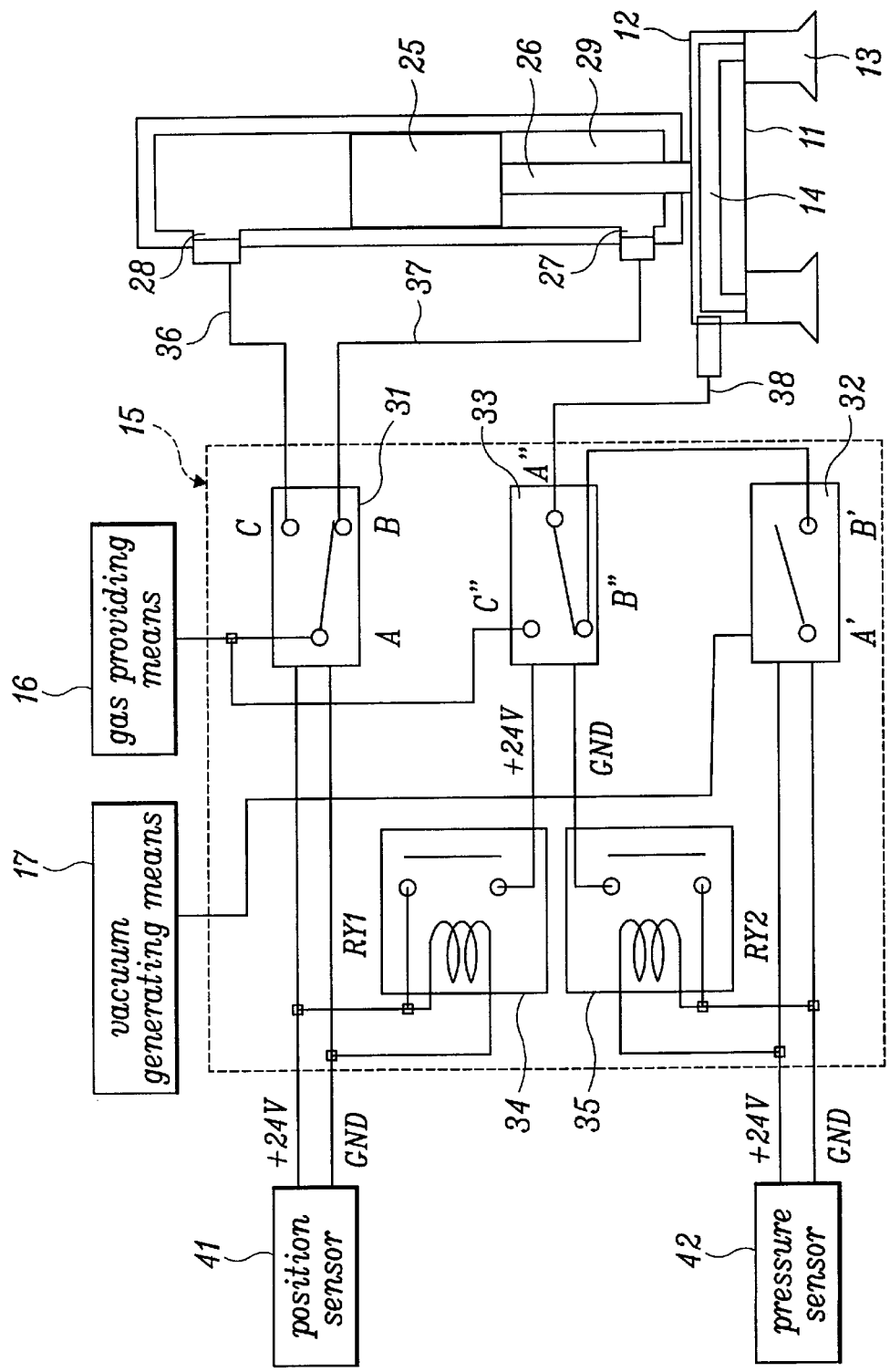
FIG. 4 is a schematic view depicting an embodiment of a controller used for transferring a wafer according to the present invention.

FIG. 4 depicts a vertical descent cylinder 29 of the transferring means 10 connected to the gas transmitting tubes 36, 37 through an upper injection gate 28 and a lower injection gate 27, respectively. A piston 25, which is connected to one end of a rod 26, is vertically displaced upward or downward within the vertical descent cylinder 29 by the pressure of the gas injected through the gas transmitting tubes 36, 37. Consequently the loading arm body 11, connected to the other end of the rod 26, moves up or down in conjunction with the vertical descent cylinder 29. The loading arm 12 is connected to the controlling means 15 through the gas transmitting tube 38. Further, the controlling means 15 is connected to the gas providing means 16 (which provides gas, e.g., the compressed air) and the vacuum generating means 17. The controlling means 15 includes a plurality of solenoid switches and relays as described below.

In a first solenoid switch 31, when the switch contacts points A–B, the gas providing means 16 blows the compressed air to the lower injection gate 27 on the lower part of the vertical descent cylinder 29 and piston 25 thereby rises, and in turn, the loading arm body 11 also rises. At this time, second and third solenoid switches 33, 32, which are connected to the suction cups 13, do not operate.

When the contact points of the first solenoid switch 31 are changed from A–B to A–C, the gas providing means 16 blows the compressed air to the upper injection gate 28 on the upper part of the vertical descent cylinder 29 and piston 25 thereby lowers, and in turn, the loading arm body 11 also lowers. At this time, a first relay 34 operates in response to a position sensor 41, such that in the second solenoid switch 33, the switch contacts points A"–C" and the compressed air is provided as a positive pressure mediated stream to the suction cups 13. The provided compressed air is blown through the suction cups 13 to remove the contaminants.

After further lowering of the loading arm body 11, the second relay 35 and third solenoid switch 32 operate in response to a pressure sensor 42. The vacuum pressure is measured with pressure sensor 42 and regulated by adjusting the second relay 35 depending on the measured pressure value. Here, the contact points of the second solenoid switch 33 change from A"–C" to A"–B". Also, in the third solenoid switch 32, when the contact points A'–B' are closed, vacuum pressure is provided to the suction cups 13 by the vacuum generating means 17. The suction cups 13 physically contact the wafer supporting means 21 to pick up and transport the wafer 20 provided thereon.

Because the suction cups 13 are used for both the functions of picking up and decontamination by the above-described controlling means 15, the present method for transferring a wafer is very effective.

According to the present method for transferring a wafer, because the wafer is transferred by picking up the wafer supporting means after removing the washing solution from the upper surface of the wafer and the wafer supporting means, it prevents breakdown and performance deterioration of the transferring device caused by remaining waste washing solution. Further, it has another advantage in that transferring of a wafer is precisely accomplished without slippage or deviation, because the wafer supporting means is picked up after complete removal of the remaining waste washing solution from the wafer supporting means.

Although preferred embodiments of the present invention have been described in detail herein above, it should be clearly understood that many variations and/or modifications of the basic inventive concepts herein taught which may appear to those skilled in the art will still fall within the spirit and scope of the present invention as defined in the appended claims.

What is claimed is:

1. A method for transferring a wafer, comprising the steps of:

decontaminating upper surfaces of each of a wafer supporting means and a wafer, wherein said wafer is provided on said wafer supporting means, comprising flow contacting said upper surface with a positive pressure mediated stream of gas from a gas providing means;

adhering said wafer supporting means having said wafer provided thereon to a transferring means using vacuum pressure from a vacuum generating means, wherein a lower surface of said wafer is adhered to said wafer supporting means, and said transferring means comprises the gas providing means and the vacuum generating means; and moving the transferring means so as to transfer the wafer to a designated position.

2. The method of claim 1, wherein said step of decontaminating comprises:

generating a positive pressure mediated stream of gas using said gas providing means; and flow contacting said upper surfaces with said positive pressure mediated stream of gas under conditions sufficient to remove contaminants, wherein said positive pressure mediated stream of gas is provided through one or more suction cups provided on said transferring means, said suction cups being connected to said gas providing means through a gas transmitting tube.

3. The method of claim 2, wherein said step of adhering comprises:

generating a vacuum using said vacuum generating means; and physically contacting said upper surface of said wafer supporting means with said vacuum under conditions sufficient to adhere said wafer supporting means having said wafer provided thereon to said transferring means without causing damage to said wafer, wherein said vacuum is provided through said one or more suction cups provided on said transferring means, said suction cups being connected to said vacuum generating means through said gas transmitting tube.

4. The method of claim 3, further comprising a step of lowering said transferring means toward said wafer supporting means, prior to said step of adhering.

5. The method of claim 4, wherein said step of decontaminating ceases prior to said step of adhering and prior to said transferring means physically contacting said wafer supporting means.

6. The method of claim 5, wherein said step of lowering and said step of decontaminating are performed simultaneously.

7. The method of claim 5, wherein said step of lowering is performed prior to said step of decontaminating.

8. A method for transferring a wafer, comprising the steps of:

lowering a transferring means, comprising a gas providing means and a vacuum generating means, toward a wafer supporting means having a wafer provided thereon;

decontaminating upper surfaces of each of said wafer supporting means and said wafer provided on said wafer supporting means, comprising flow contacting said upper surface with a positive pressure mediated stream of gas provided from said gas providing means;

vacuum adhering said wafer supporting means having said wafer provided thereon to said transferring means using vacuum pressure provided from said vacuum generating means, wherein provision of said positive pressure mediated stream of gas ceases prior to said step of vacuum adhering; and raising the transferring means such that the wafer is transferred to a designated position.

9. The method of claim 8, wherein said step of lowering and said step of decontaminating are performed simultaneously.

10. The method claim 9, further comprising a step of sensing a distance between said transferring means and said wafer supporting means using a sensing means, wherein said step of decontaminating ceases when a designated distance between said transferring means and said wafer supporting means has been reached as determined by said sensing means.

11. The method of claim 8, wherein said step of lowering is performed prior to said step of decontaminating, and wherein said step of lowering ceases when a designated distance between said transferring means and said wafer supporting means has been reached as determined by a sensing means.

* * * * *